United States Patent
Cho

Patent Number: 6,087,718
**Date of Patent: *Jul. 11, 2000**

[54] STACKING TYPE SEMICONDUCTOR CHIP PACKAGE

[75] Inventor: Jae Weon Cho, Chungcheongbuk-do, Rep. of Korea

[73] Assignee: LG Semicon Co., Ltd., Cheongju-si, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/990,718

[22] Filed: Dec. 15, 1997

[30] Foreign Application Priority Data

Dec. 27, 1996 [KR] Rep. of Korea ............... 96-73494

[51] Int. Cl.⁷ .................................................. H01L 23/02
[52] U.S. Cl. ........................... 257/686; 257/692; 257/777
[58] Field of Search ................................ 257/686, 723, 257/724, 725, 685, 690, 693, 695, 777, 692

[56] References Cited

U.S. PATENT DOCUMENTS

| | | |
|---|---|---|
| 5,068,712 | 11/1991 | Murakami et al. . |
| 5,095,402 | 3/1992 | Hernandez et al. ............ 257/724 |
| 5,327,104 | 7/1994 | Kikushima ..................... 257/724 |
| 5,332,922 | 7/1994 | Oguchi et al. .................. 257/725 |
| 5,422,435 | 6/1995 | Takiar et al. ................... 257/686 |
| 5,438,224 | 8/1995 | Papageorge et al. ........... 257/686 |
| 5,463,253 | 10/1995 | Waki et al. ..................... 257/724 |
| 5,471,369 | 11/1995 | Honda et al. ................... 257/686 |
| 5,479,051 | 12/1995 | Waki et al. ..................... 257/725 |
| 5,545,922 | 8/1996 | Golwalker et al. ............. 257/686 |
| 5,579,208 | 11/1996 | Honda et al. ................... 257/686 |
| 5,689,135 | 11/1997 | Ball ................................ 257/724 |

*Primary Examiner*—Donald L. Monin, Jr.

[57] ABSTRACT

A stacked-type semiconductor chip package of a lead on chip structure which is modified for stacking chips in the package, including a plurality of leads each having an inner lead portion and an outer lead portion extending from the inner lead portion, a lower semiconductor chip having a plurality of center pads and disposed under the inner lead portion, an upper semiconductor chip having a plurality of side pads and disposed above the inner lead portions, a plurality of side adhesive insulating members inserted between the inner lead portions and each of the upper and lower semiconductor chips, a plurality of wires which provide electrical connection between the pads and the inner lead portions, and a molding body which seals the structure other than the outer lead portions.

23 Claims, 1 Drawing Sheet

STACKING TYPE SEMICONDUCTOR CHIP PACKAGE

BACKGROUND OF THE INVENTION

1. Field of the Invention

The present invention relates to a stacking type semiconductor chip package and, more particularly, to a stacking type semiconductor chip package of a LOC (Lead On Chip) structure which is modified for stacking chips in the package.

2. Discussion of the Conventional Art

In general, a LOC package, which represents a large scale integration technique, has an end of a lead frame lead to the central top portion of a chip where it is connected by wire bonding to a pad, which functions as an external terminal on the central part of the chip. In comparison to prior type packages, such as DIP which has lead frames arranged on the sides of chips, the LOC package is advantageous in that the width of a chip placed within the width of a molding body can be made wider.

FIG. 1 illustrates an example of a conventional LOC package disclosed by U.S. Pat. No. 5,068,712. In fabricating the conventional LOC package of U.S. Pat. No. 5,068,712, a semiconductor chip 5, having a center pad 4 provided in the central part of the package and an insulating coating on top of the chip is attached to an inner lead 1a of a lead 3a using a double-faced adhesive insulating tape 8a. Then, a wire bonding is conducted in which the inner lead 1a of the lead frame and the center pad 4 are connected with a wire 9 having a very fine metallic line. The package is molded with a molding resin 10 to complete the packaging.

However, the conventional package has the following disadvantage.

The conventional LOC package, which contains only one chip within the molding body 10, is not effective in increasing the capacity of its semiconductor chip package. If it is intended to increase the integration capacity of the semiconductor chip package by mounting many packages on a mounting board, this approach is not advantageous toward making an electronic device lighter, thinner, shorter, and smaller because the mounting board will become too large.

SUMMARY OF THE INVENTION

Accordingly, the present invention is directed to a stacking type semiconductor chip package that substantially obviates one or more problems, limitations, and disadvantages of the conventional art.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

To achieve these and other advantages and in accordance with the purpose of the present invention, as embodied and broadly described, the stacking type semiconductor chip package includes a plurality of leads each having an inner lead with bent portions and an outer lead extending from the inner lead. A lower semiconductor chip has a plurality of center pads and is disposed below the inner leads, and an upper semiconductor chip has a plurality of side pads and is disposed above the inner leads. More than one double-sided adhesive insulating member is inserted between the inner leads and each of the upper and lower semiconductor chips. A plurality of wires are provided to achieve electrical connection between one of the pads and one of the inner leads, and a molding body 10 is provided for sealing parts other than the outer leads.

It is to be understood that both the foregoing general description and the following detailed description are exemplary and explanatory in nature and are intended to provide further explanation of the present invention as claimed.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE PREFERRED EMBODIMENT

Reference will now be made in detail to the preferred embodiments of the present invention, examples of which are illustrated in the accompanying drawings.

Figure 1:
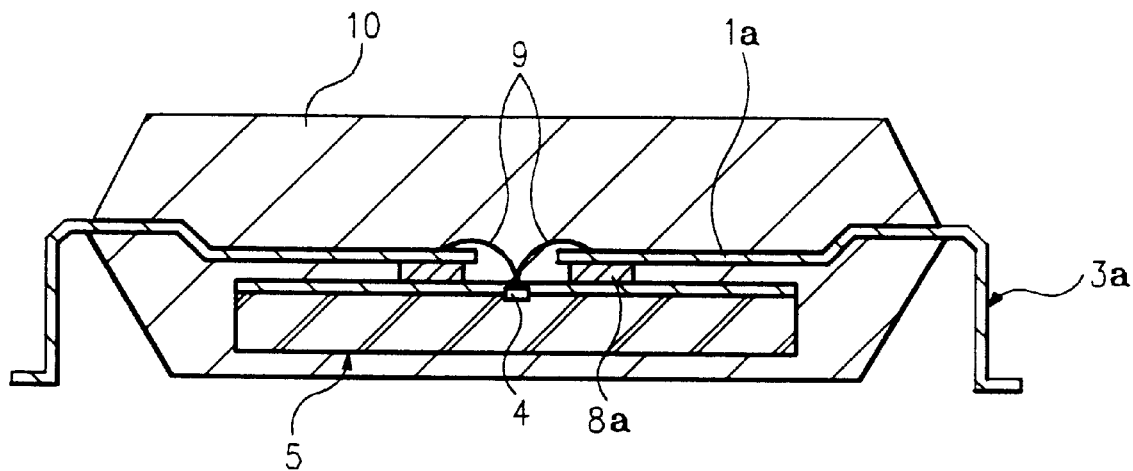
FIG. 1 illustrates a longitudinal section of a conventional LOC semiconductor chip package; and, FIG. 2 illustrates a longitudinal section of a semiconductor chip package in accordance with one preferred embodiment of the present invention.
Figure 2:
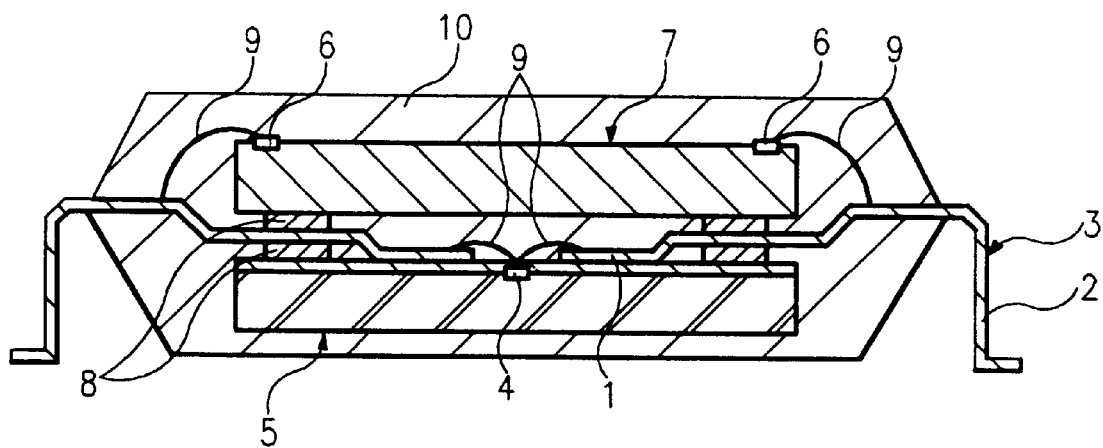

One preferred embodiment of the present invention will now be explained with reference to the attached drawing of FIG. 2. FIG. 2 illustrates a longitudinal section of a semiconductor chip package in accordance with one preferred embodiment of the present invention.

Referring to FIG. 2, the semiconductor chip package, in accordance with one preferred embodiment of the present invention, includes a plurality of leads 3 each having an inner lead 1 with bent parts and an outer lead 2 extended from the inner lead 1, a lower semiconductor chip 5 having a plurality of center pads 4 and disposed under the inner leads 1, an upper semiconductor chip 7 having a plurality of side pads 6 and disposed over the inner leads 1, more than one double-sided adhesive insulating members 8 inserted between the inner leads 1 and each of the upper and lower semiconductor chips 5 and 7, a plurality of wires 9 for providing electrical connection between one of the pads 4 and 6 and one of the inner leads 1, and a molding body 10 for sealing the elements other than the outer leads 2.

The bent portions in the inner lead 1 form two stepped regions. Ends of one of the wires are bonded on one of the center pads for the lower semiconductor chip and to an end of the one of the inner leads, whereas one of the side pads for the upper semiconductor chip is bonded to the bent upper part of one of the inner leads to provide electrical connection therebetween. The double-faced adhesive insulating members 8 have a center layer of a polyamide resin, a layer of thermosetting resin, and an adhesive coated on both sides of the layer.

The process steps for fabricating the aforementioned stacking type semiconductor chip package in accordance with a preferred embodiment of the present invention will now be explained.

First, an inner lead 1 is formed to have bent portions with two steps, and a double-faced adhesive insulating member 8 is attached to the inner lead on each side of a second step portion. The double-faced adhesive insulating member 8 is made of a polyamide resin layer with an adhesive coated on both faces thereof, which is formed separately and introduced into the process. After attachment of the double-faced adhesive insulating members on both sides of the second step portion, the lower semiconductor chip 5 is attached to the exposed surface of the double-faced adhesive insulating member 8 which had been previously attached under the second step portion of the inner lead 1. A plurality of center pads 4, which are electrical terminals, are disposed, in advance, arranged on the center portion of the lower semiconductor chip 5, in parallel to the major sides of the semiconductor chip. After the attachment of the lower semiconductor chip 5 to the double-faced adhesive insulating member 8 on the second step portion under the inner lead 1, a bonding of the first wire 9 is effected in which the plurality of center pads 4 on the lower semiconductor chip 5 are electrically connected to the respective ends of the plurality of inner leads 1. After the first wire bonding in which the plurality of center pads 4 on the lower semiconductor chip 5 and ends of the plurality of inner leads 1 are electrically connected, respectively, the upper semiconductor chip 7 is attached to the exposed surfaces of the double-faced adhesive insulating members 8, attached on an upper side of the second step portion of the inner lead 1. A plurality of side pads 6, which are electrical terminals, are previously disposed at the edge portions of the upper semiconductor chip 7 in parallel to the major sides of the semiconductor chip 7. After the aforementioned attachment of the upper semiconductor chip 7, a second wire 9 is bonded to the side pads 6, which are electrical terminals provided at the upper edge portions of the upper semiconductor chip 7, and to the outer upper portions of the second step of the inner leads 1 to form an electrical connection therebetween. After the successive attachment of the upper and lower semiconductor chips 5 and 7 and the subsequent first and second wire bondings 9, all the components of the upper and lower semiconductor chips 5 and 7, the inner leads 1, the wires 9 and the double-faced adhesive insulating members 8 are molded together with a molding resin so that only the outer leads 2 are exposed. Thus, since the semiconductor chips can be stacked within the molding body 10 formed by hardening a molding resin, the semiconductor chip package of the present invention can increase the capacity of the semiconductor chip package.

As has been explained, since the present invention facilitates the stacking of the chips through a structural modification of an LOC structure package, resulting in an increase in the integration capacity of the semiconductor chip package, the present invention has many advantages, whereby products can be made to be compact in various electronic applications, because it reduces the mounting area of the semiconductor chip packages in mounting the packages on a mounting board.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A stacked-type semiconductor chip package comprising:
   a first chip;
   a second chip;
   a plurality of leads positioned between the first and second chips and having first, second and third portions;
   a plurality of first media connecting the leads to an interface of the first chip;
   a plurality of second media connecting the third portions of the leads to an interface of the second chip; and
   a molding body encapsulating the first and second chips, the leads, and the first and second media,
   wherein the first portions are positioned closer to the interface of the first chip than the second portions, and the third portions are positioned closer to the interface of the second chip than the second portions,
   wherein the first, second and third portions of the leads extend along different planes, and
   wherein the first, second and third portions of the leads respectively extend along different but parallel planes.

2. The stacked-type semiconductor chip package of claim 1, wherein the first and second chips are attached to the second portions of the leads.

3. The stacked-type semiconductor chip package of claim 2, further comprising adhesive members for attaching the leads to the first and second chips.

4. The stacked-type semiconductor chip package of claim 1, wherein the first media connect the first portions of the leads to the interface of the first chip.

5. The stacked-type semiconductor chip package of claim 1, wherein the interface of the first chip includes first bonding pads positioned at a center portion of the first chip.

6. The stacked-type semiconductor chip package of claim 1, wherein the interface of the second chip includes second bonding pads positioned at both side portions of the second chip.

7. The stacked-type semiconductor chip package of claim 1, wherein the first and second chips each have first and second parallel surfaces such that the first surface of the first chip is closest to the second surface of the second chip, and where the first surface of the first chip and the second surface of the second chip are attached to the leads.

8. The stacked-type semiconductor chip package of claim 1, wherein the first media connect the first chip to a nearest surface of the first portions.

9. The stacked-type semiconductor chip package of claim 1, wherein the second media connect the second chip to a nearest surface of the third portions.

10. The package of claim 1, wherein the planes are parallel to a plane defined by at least one surface of the first and second chips.

11. The package of claim 1, wherein the first and second portions of the leads respectively extend along different but parallel planes.

12. The package of claim 11, wherein the planes are parallel to a plane defined by at least one surface of the first and second chips.

13. A stacked-type semiconductor chip package comprising:
    first and second chips;
    a plurality of leads positioned between first and second chips and having first and second portions for interfacing with the first and second chips;
    a plurality of first media connecting the first portions of the leads to an interface of the first chip; and
    a plurality of second media connecting the second portions of the leads to an interface of the second chip;
    wherein the first portions are positioned closer to the interface of the first chip than the second portions, and the second portions are positioned closer to the interface of the second chip than the first portions, wherein the first and second portions of the leads extend along different planes, wherein the leads further comprise third portions, the first portions being positioned closer to the interface of the first chip than the third portions, and the second portions being positioned closer to the interface of the second chip than the third portions, and wherein the first and second chips are attached to the third portions of the leads.

14. The stacked-type semiconductor chip package recited by claim 13, further comprising:

a molding body encapsulating the first and second chips, the leads, and the first and second media.

15. The stacked-type semiconductor chip package recited by claim 13, further comprising an adhesive insulating layer for attaching the first and second chips to the third portions of the leads.

16. The stacked-type semiconductor chip package of claim 13, wherein the first media connect the first portions of the leads to the interface of the first chip.

17. The stacked-type semiconductor chip package of claim 13, wherein the interface of the first chip includes first bonding pads positioned at a center portion of the first chip.

18. The stacked-type semiconductor chip package of claim 13, wherein the interface of the second chip includes second bonding pads positioned at both side portions of the second chip.

19. The stacked-type semiconductor chip package of claim 13, wherein the first and second chips each have first and second parallel surfaces such that the first surface of the first chip is closest to the second surface of the second chip, and where the first surface of the first chip and the second surface of the second chip are attached to the leads.

20. The stacked-type semiconductor chip package of claim 13, wherein the first media connect the first chip to a nearest surface of the first portions.

21. The stacked-type semiconductor chip package of claim 13, wherein the second media connect the second chip to a nearest surface of the second portions.

22. A stacked-type semiconductor chip package comprising:

a first chip;

a second chip;

a plurality of leads positioned between the first and second chips and having first, second and third portions;

a plurality of first media connecting the leads to an interface of the first chip;

a plurality of second media connecting the third portions of the leads to an interface of the second chip; and a molding body encapsulating the first and second chips, the leads, and the first and second media, wherein the first portions are positioned closer to the interface of the first chip than the second portions, and the third portions are positioned closer to the interface of the second chip than the second portions, wherein the first, second and third portions of the leads extend along different planes, and wherein the first and second portions of the leads respectively extend along different but parallel planes.

23. A stacked-type semiconductor chip package comprising:

a first chip;

a second chip;

a plurality of leads positioned between the first and second chips and having first, second and third portions;

a plurality of first media connecting the leads to an interface of the first chip;

a plurality of second media connecting the third portions of the leads to an interface of the second chip; and a molding body encapsulating the first and second chips, the leads and the first and second media, wherein the first portions are positioned closer to the interface of the first chip than the second portions, and the third portions are positioned closer to the interface of the second chip than the second portions, wherein the first, second and third portions of the leads extend along different planes, and wherein the planes are parallel to a plane defined by at least one surface of the first and second chips.

* * * * *